United States Patent [19]

Schutten et al.

[11] Patent Number: 4,546,367
[45] Date of Patent: Oct. 8, 1985

[54] LATERAL BIDIRECTIONAL NOTCH FET WITH EXTENDED GATE INSULATOR

[75] Inventors: Herman P. Schutten, Milwaukee, Wis.; Robert W. Lade, Fort Myers, Fla.; James A. Benjamin, Waukesha, Wis.

[73] Assignee: Eaton Corporation, Cleveland, Ohio

[21] Appl. No.: 390,473

[22] Filed: Jun. 21, 1982

[51] Int. Cl.[4] ............................................. H01L 29/78
[52] U.S. Cl. ................................ 357/23.4; 357/23.14; 357/55; 357/59; 357/86
[58] Field of Search .................... 357/55, 59, 86, 23.4, 357/23.14

[56] References Cited

U.S. PATENT DOCUMENTS

| | | | |
|---|---|---|---|
| 3,798,514 | 3/1974 | Hayashi et al. | 357/23 VD |
| 4,152,714 | 5/1979 | Hendrickson et al. | 357/41 |
| 4,199,774 | 4/1980 | Plummer | 357/23 VD |
| 4,243,997 | 1/1981 | Natori et al. | 357/23 VD |

OTHER PUBLICATIONS

P. Ou-Yang, "Double Ion-Implanted V-MOS Tech.," J. of S-S Ckts., vol. SC-12 #1, Feb. 1977, pp. 3-10.
H. Lee et al., "Short Channel FETs in V-Grooves," IBM Tech. Discl. Bull., vol. 22 #8B, Jan. 1980, pp. 3630-3634.

Primary Examiner—Joseph E. Clawson, Jr.
Attorney, Agent, or Firm—Andrus, Sceales, Starke & Sawall

[57] ABSTRACT

Lateral FET structure is disclosed for bidirectional power switching, including AC application. A notch extends downwardly from a top major surface to separate left and right source regions and left and right channel regions, and direct the drift region current path between the channels around the bottom of the notch. Gate electrode means in the notch proximate the channels controls bidirectional conduction.

10 Claims, 21 Drawing Figures

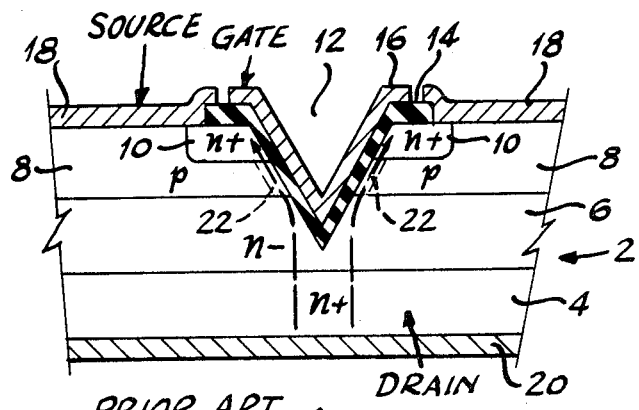
Fig. 1 VMOS FET — PRIOR ART
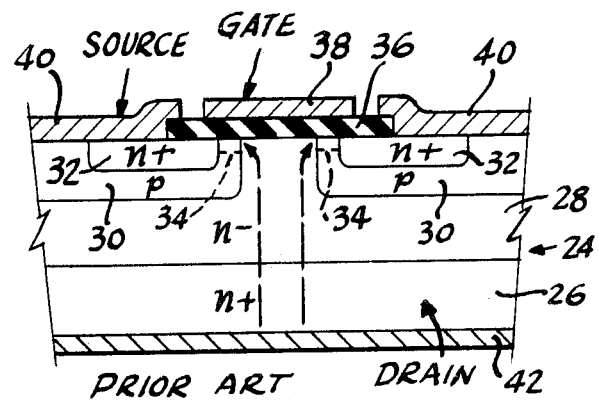
Fig. 2 DMOS FET — PRIOR ART
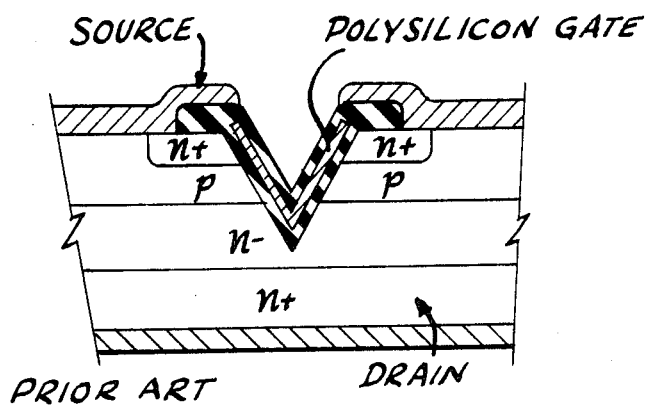
Fig. 3 VMOS WITH POLY-SI GATE — PRIOR ART

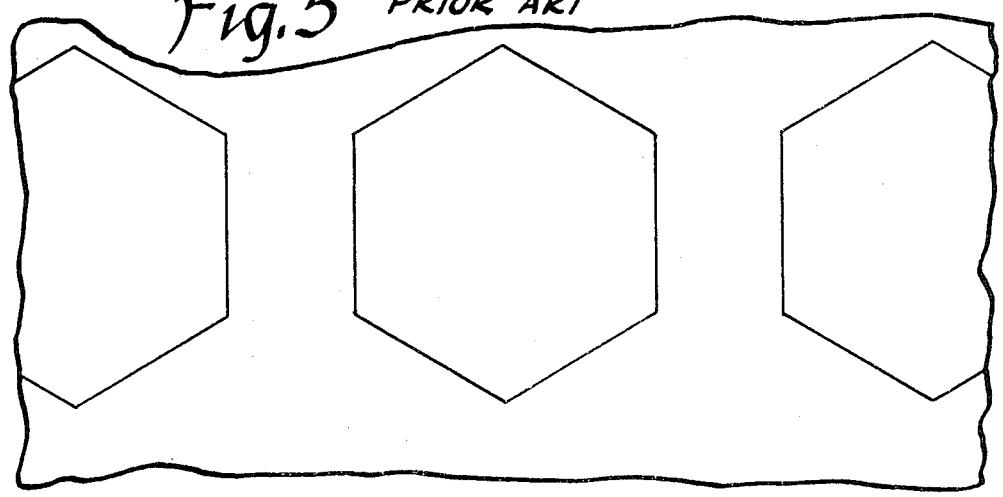
Fig. 5 PRIOR ART
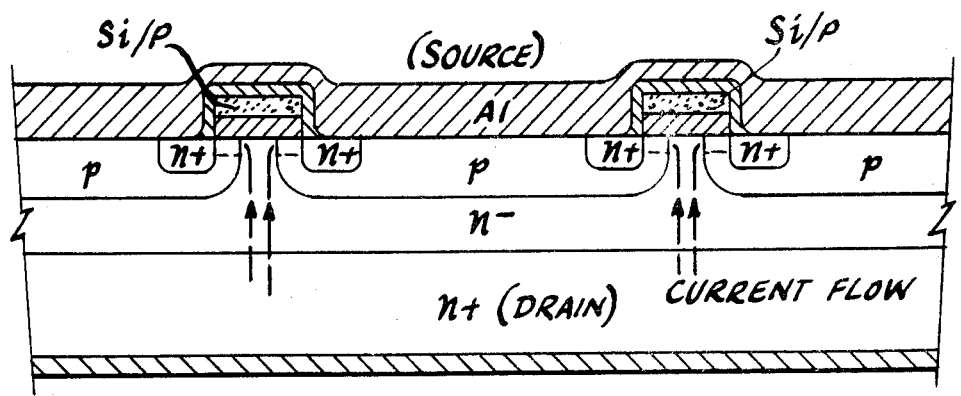
Fig. 4 PRIOR ART DMOS WITH POLY-SI GATE (HEX FET)
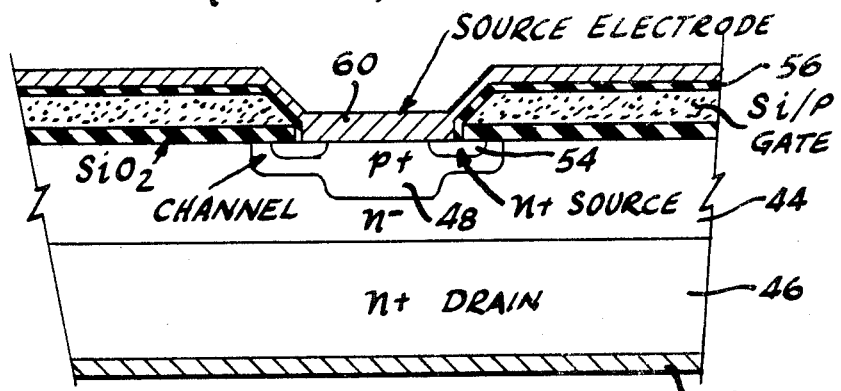
Fig. 6 PRIOR ART SIPMOS FET

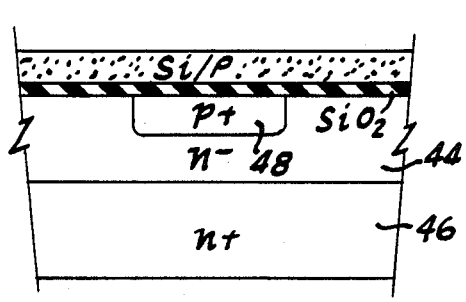
Fig. 7 PRIOR ART
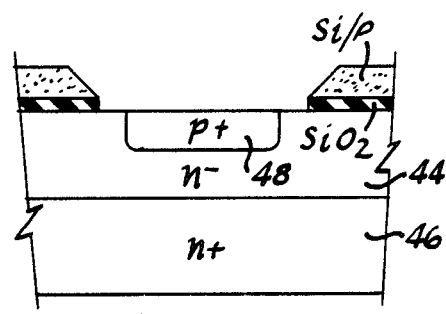
Fig. 8 PRIOR ART
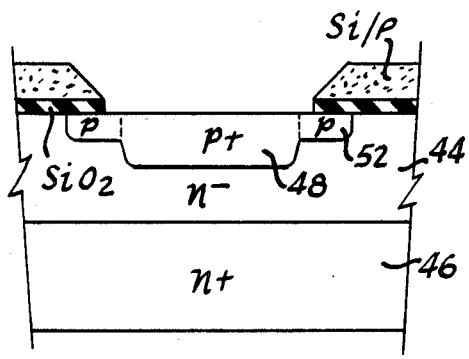
Fig. 9 PRIOR ART
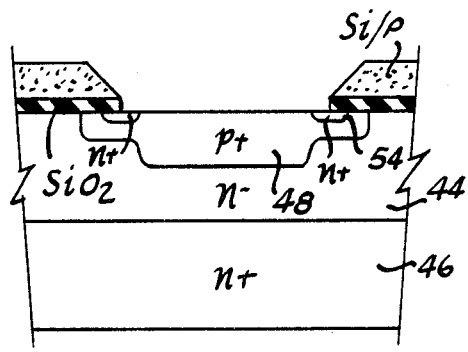
Fig. 10 PRIOR ART
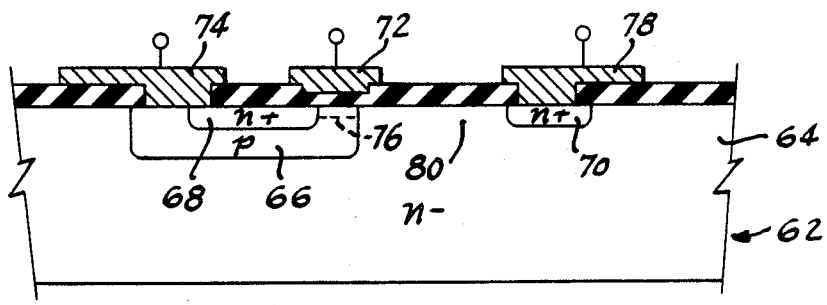
Fig. 11 PRIOR ART LATERAL MOSFET

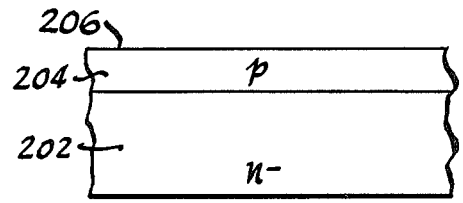
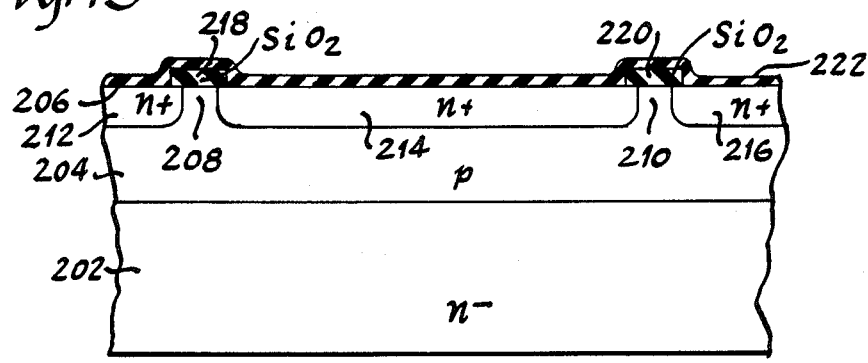
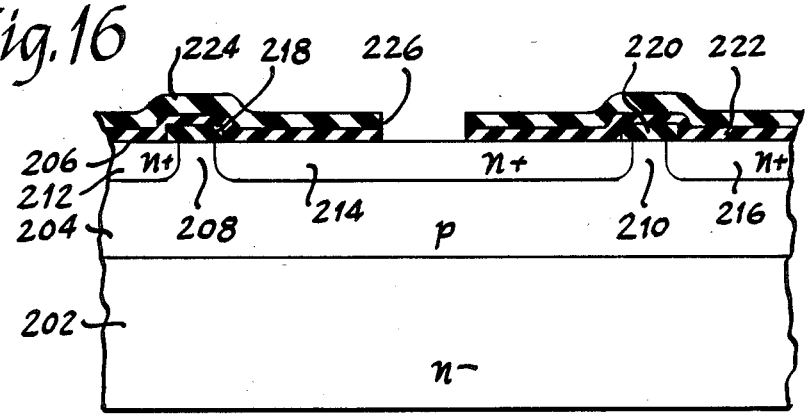
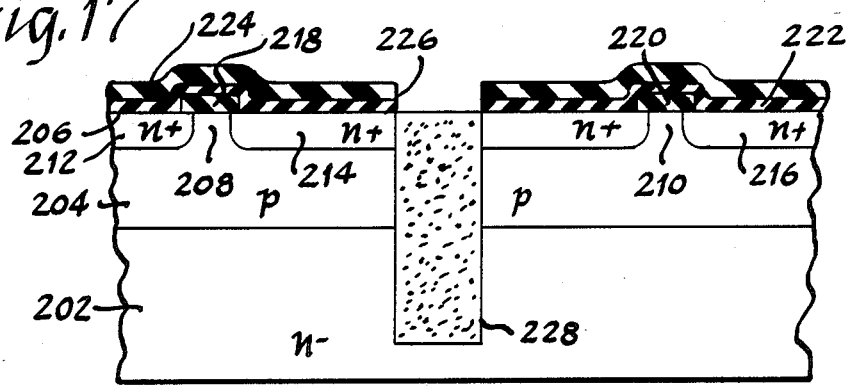

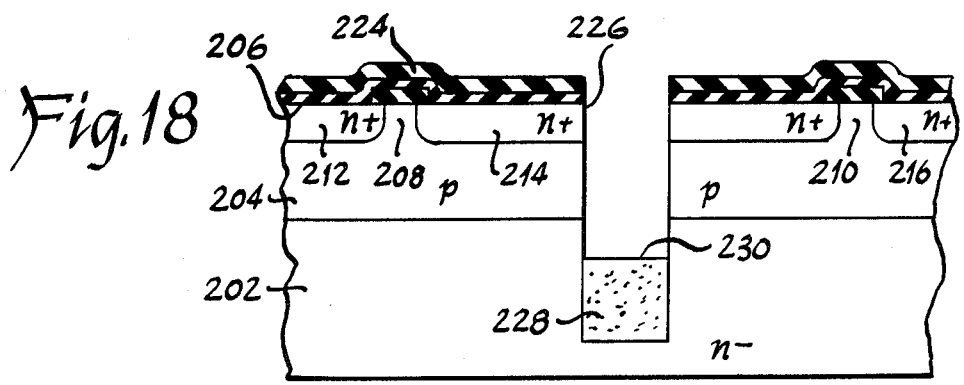
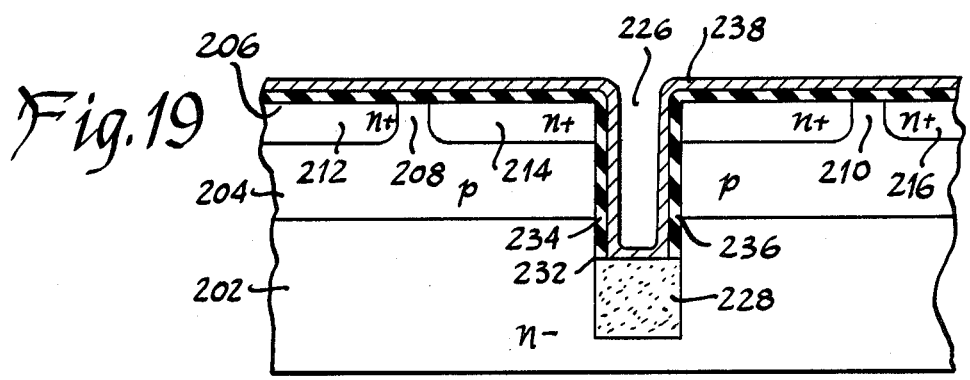
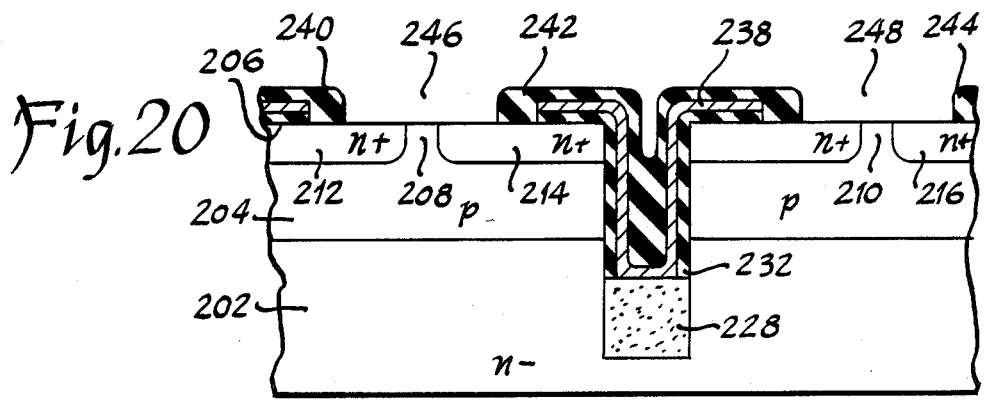

LATERAL BIDIRECTIONAL NOTCH FET WITH EXTENDED GATE INSULATOR

TECHNICAL FIELD

The invention relates to power switching semiconductors, and more particularly to power MOSFETs (Metal Oxide Semiconductor Field Effect Transistors), and the like.

BACKGROUND

The present invention evolved from efforts to develop a solid state device for high power switching applications to replace the low current circuit breaker or contactor, though the invention is of course not limited thereto. Performance requirements for such a device are demanding, and even modest specifications might include a 400 volt blocking capability with a corresponding ON state resistance of 0.05 ohms and an AC current rating 20 amps rms. Further, the system should be capable of interrupting a fault current of 5,000 amps without destroying itself. Additionally, manufacturing cost should be less than or equal to the circuit breaker or contactor cost.

High power switching in solid state devices has evolved over the last 30 years from the early milliwatt devices to the present kilowatt "hockey puck" thyristor devices. Device processing has evolved from the early restrictive alloy/rate grown devices to planar and MOS VLSI structures, bringing the blocking voltages of switches from the 10 volt level of the 1950's to the kilovolt range today. Even with these great strides, however, the problem of developing a semiconductor device to replace the low current circuit breaker or contactor has remained unsolved.

There are three likely candidates for high power switching applications. Two of these are bipolar, i.e. they depend on the flow of two types of carriers, majority and minority. The third is unipolar, i.e. it depends only on majority carrier current flow.

The first two candidates are the thyristor and the bipolar transistor. Although the thyristor is capable of blocking a high reverse voltage, it can be characterized in the forward ON state by a fixed voltage source (one junction drop) and a resistance with a negative temperature coefficient, i.e. resistance decreases with increasing temperature. The bipolar transistor can be characterized in the forward ON state simply as a resistance with a negative temperature coefficient. In each case, it is extremely difficult to accommodate large current ratings through the paralleling of bipolar devices due to the effect of "current hogging". If a number of these devices are paralleled, and if one unit draws slightly more current than the others, it will heat up and its resistance will be reduced. This results in a still larger share of the current, further heating, etc. The result is usually the thermal destruction of that device and the subsequent overloading of the others. In general, current hogging prevents paralleling of these devices unless ballast resistance, a form of stabilizing negative feedback, is introduced. This resistance further adds to the total ON state resistance and is therefore highly undesirable. Other disadvantages are false dv/dt triggering of thyristors, and secondary breakdown problems in bipolar transistors.

The third candidate, the field effect transistor (FET), is exclusively a majority carrier device. Its resistance is related to temperature through the electron mobility. Its resistance has a positive temperature coefficient, namely the resistance is proportional to $T^{3/2}$. Since the electron mobility is 2.5 times greater than the hole mobility in silicon, the n channel device leads to lower ON state resistance. Further, since MOS devices give conductivity enhancement in the ON state, these devices are generally more conductive than their junction depletion-mode counterparts (JFET). Additionally, since minimal channel length (for low ON state resistance) and high packing densities are desirable, the vertical power MOSFET presently is leading all others in the power switching field.

Current commercially available MOSFETs have performance specifications approximately one order of magnitude below the minimal requirements noted above. Two current designs are the SIPMOS device and the HEXFET device, discussed more fully hereinafter.

In lateral power FETs, there is an inherent trade-off between voltage blocking capability and the lateral dimension or length of the drift region. Minimum ON state resistance demands minimum drift region length. But maximum blocking voltage commands maximum drift region length. This relationship is characterized by the equation $R_{on} = kV_B^{2.6}$ ohm-cm$^2$ where $R_{on}$ where $R_{on}$ is the ON state resistance, k is a constant ($3.7 \times 10^{-9}$) and $V_B$ is the blocking voltage. This relationship has been studied in the literature, C. Hu, "Optimum Doping Profile For Minimum Ohmic Resistance and High Breakdown Voltage", IEEE Transactions Electron Devices, Volume ed-26, pages 243–244, 1979.

SUMMARY

The present invention provides lateral power FET structure which is bidirectional, i.e. current can flow in either direction when the device is in the ON state, whereby to afford AC application.

A notch gate structure is provided to afford increased OFF state voltage blocking capability, including non-floating gate implementations.

A notch extends downwardly from a top major surface to separate right and left source regions and right and left channel regions, and direct the drift region current path between the channels around the bottom of the notch. Gate electrode means are provided in the notch proximate the channels for controlling bidirectional conduction.

Blocking voltage is increased without increasing the lateral dimension of the drift region. In preferred form, the notch has a lower insulative portion extending downwardly into the drift region to a depth substantially below the gate electrode means in the notch.

In a desirable aspect, the structure of the invention involves easy processing steps. In another aspect, the structure is suited to manufacture in a repetitive multi-cell matrix array, affording plural FET integrated structure.

BRIEF DESCRIPTION OF THE DRAWINGS

Prior Art

FIGS. 1 through 11 show prior art.

FIG. 1 is a schematic cross-sectional view of a VMOS FET.

FIG. 2 is a schematic cross-sectional view of a DMOS FET.

FIG. 3 is a schematic cross-sectional view of a VMOS FET with a polysilicon gate.

FIG. 4 is a schematic cross-sectional view of a DMOS FET with a polysilicon gate (HEXFET).

FIG. 5 shows a top view of the structure of FIG. 4, illustrating the HEX outline.

FIG. 6 is a schematic cross-sectional view of a SIPMOS FET.

FIGS. 7 through 10 schematically illustrate the process steps yielding the structure of FIG. 6.

FIG. 11 is a schematic cross-sectional view of a lateral MOSFET.

Present Invention

Figure 12:
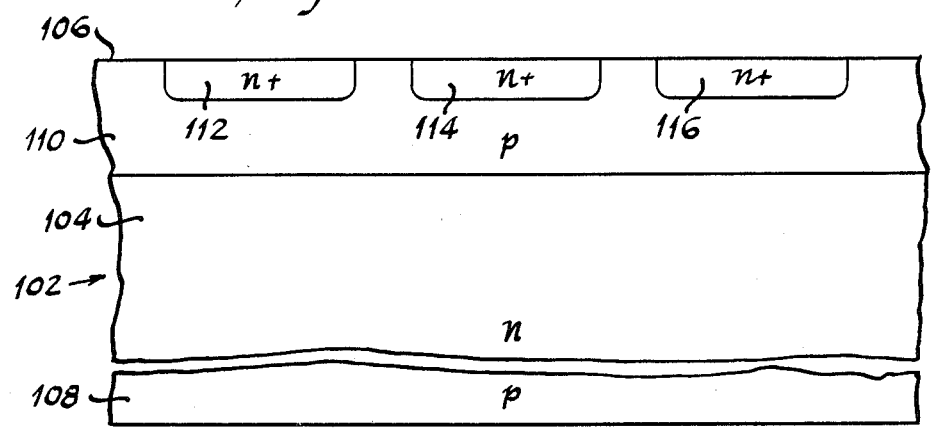

FIG. 12 is a schematic sectional view illustrating the initial process steps in providing FET structure constructed in accordance with the invention.

Figure 13:
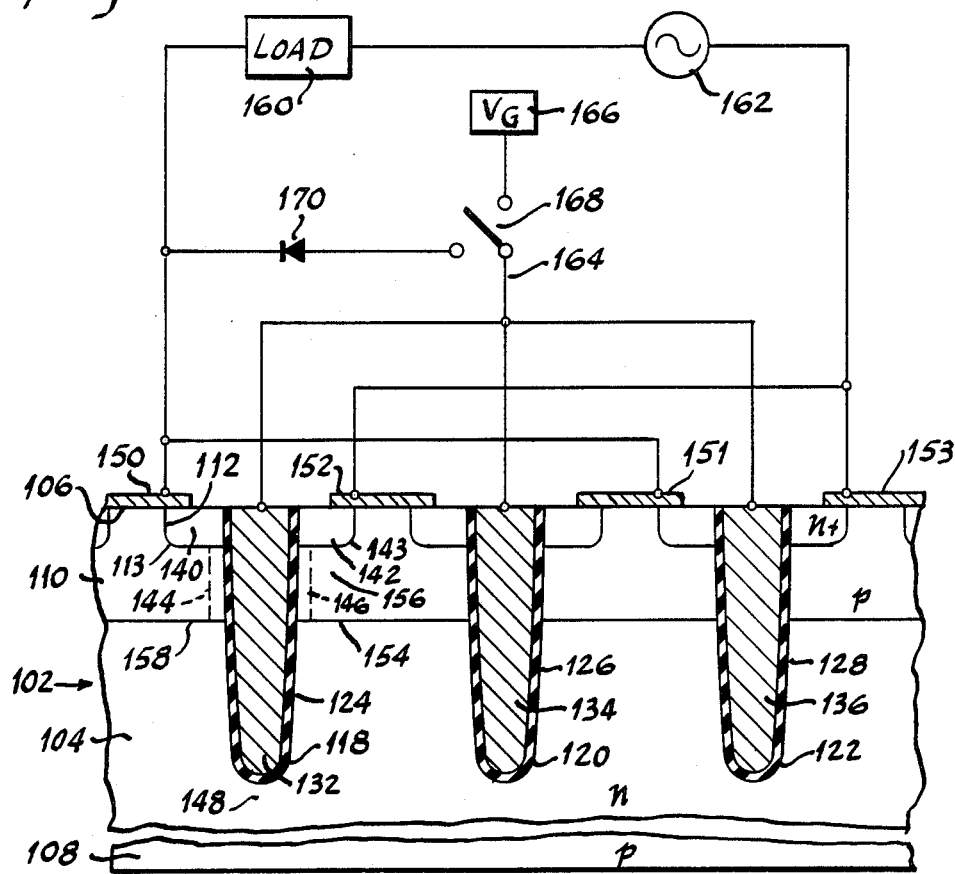

FIG. 13 is a schematic sectional view of completed FET structure constructed in accordance with the invention.

FIGS. 14 through 21 show the preferred processing and structure of the invention.

DESCRIPTION OF PRIOR ART AND POWER MOSFET TECHNOLOGY

MOSFETs can generally be classified into two groupings according to the principle orientation of current flow, namely vertical and lateral. For the vertical units, there are two predominant geometries, planar (HEXFET, TMOS, SIPMOS, etc.), and non-planar (VMOS, UMOS, etc.). The advantage that these devices enjoy over their lateral counterparts is that the drain contact is placed on the bottom of the chip. Thus, for a given chip area, higher current ratings (higher packing densities) are possible. As a consequence, almost all power MOSFET design has been concentrated on vertical configurations.

A cross-sectional view of a typical non-planar vertical device is illustrated in FIG. 1, showing a VMOS structure 2. The starting material is an n+ silicon wafer 4 with an n− epitaxial layer 6. Successive p and n+ diffusions are carried out, yielding layers 8 and 10. A groove is anisotropically etched to yield V-groove 12. An insulating oxide layer 14 is formed in the groove, followed by deposition of gate metalization 16. Source metalization 18 is deposited on the top major surface, and drain electrode metalization 20 is deposited on the bottom major surface.

FET channel 22 is through p region 8 along the edge of the V-groove. Upon application of a positive voltage on gate electrode 16 relative to source electrode 18, electrons in p region 8 are attracted into channel 22 to invert the conductivity type of the channel to n type. Electrons may then flow from source region 10 through channel 22 to drain region 4, and hence current may flow from drain electrode 20 through drain region 4 through channel 22 through source region 10 to source electrode 18.

One of the main advantages of the VMOS design is that the active channel length is extremely small and is determined by the difference in depth between the n+ source diffusion 10 and the p body diffusion 8. The technology in diffusion is sufficiently well advanced so that this dimension can be very tightly controlled. Thus the channel resistance can be closely held to a maximum specification.

One type of VMOS or UMOS (truncated VMOS) design is the notched MOSFET structure, for example "A Parametric Study of Power MOSFETs" C. Hu, IEEE Electron Device Conference, paper CH 1461-3/79, 0000-0385. Notched grooves as narrow as 1 micron are provided by anisotropic etching, IEEE Transactions Electron Device, Volume ED-25, #10, October 1978, and "UMOS Transistors on (110) Silicon", Ammar and Rogers, Transactions IEEE, ED-27, May 1980, pages 907-914.

An alternative configuration is the DMOS (double diffused metal oxide semiconductor) FET 24, FIG. 2. N+ starting material 26 has an n− epilayer 28 into which p and n+ diffusions form regions 30 and 32. FET channel region 34 is formed at the top major surface over which insulating layer 36 is deposited, followed by gate metalization 38. Upon application of a positive voltage on gate electrode 38 relative to source electrode 40, electrons in p type region 30 are attracted towards the gate and congregate at the top major surface to thus invert the conductivity type along channel region 34 to n type. Current thus flows from drain electrode 42 through regions 26 and 28 and then through channel region 34 and then through source region 32 to source electrode 40, as shown by dashed line.

In the VMOS, UMOS and DMOS devices, the p body and the n+ source diffusions are carried out through the same opening in a silicon dioxide covering layer. As a consequence, the active channel region in DMOS FETs is also controlled by the difference in the diffusion depths. Lateral penetration is about 80% that of the vertical depth.

Stability of the operating specifications in MOS devices involves control of their threshold voltages, i.e. the value of the gate voltage required to produce the onset of drain to source conduction. This parameter is strongly influenced by the surface conditions of the silicon just over the channel region and the purity of the silicon dioxide, $SiO_2$ such as layers 14, FIG. 1, and 36, FIG. 2. During the thermal growth of the oxide, hydrogen chloride is introduced into the system to act as a gettering agent, thus providing fairly pure material.

A particularly troublesome element is sodium because any Na+ ions in the oxide tend to reduce the threshold of n channel devices, and an overabundance of them can prevent turn-off altogether. If aluminum gate metal is placed directly onto the gate oxide, these ions, if present in the aluminum, can drift into the silicon dioxide and degrade the device performance. This is true for VMOS, UMOS, and DMOS devices.

If, however, the transistors are fabricated with a phosphorous rich polycrystalline silicon (polysilicon or poly-si) gate, the technology for these materials allows much purer gates to be constructed with much more stable thresholds. Examples of VMOS and DMOS (HEXFET) devices utilizing this technology are shown in FIGS. 3 and 4. FIG. 5 shows a top view of the structure of FIG. 4, illustrating the HEX outline. Gate electrode connections are attached along the edge of the wafer. The VMOS structure is classified as a vertical non-planar unit. The HEXFET structure is a vertical planar unit.

Another vertical planar unit is the SIPMOS structure shown in FIG. 6. An n− epitaxial layer 44 is grown on an n+ substrate 46, FIG. 7. The thickness and resistivity of epilayer 44 is determined by the breakover voltage versus ON state resistance compromise. Using standard photolithography techniques, a p+ layer 48 (boron) is driven into the epilayer approximately 2 to 3 microns. The wafer is then stripped of old silicon dioxide and a new extremely clean 50 to 60 nanometer silicon dioxide layer is grown, usually in an environment of hydrogen chloride. Polycrystalline silicon is then deposited on top of the wafer using the LPCVD (low pressure chemical vapor deposition) method. An n+ diffusion into the entire polysilicon layer is then performed to provide for the gettering action of the phosphorous against sodium ions and provide a means to reduce the resistivity of the gate material, although it will still be a factor of 3,000 higher than aluminum. The entire surface of the polysilicon-phosphorous (Si/P) layer is bombarded by ion implantation in order to intentionally damage the top surface. Photoresist material is placed on the Si/P, developed and etched. Since the top etches faster than the bottom, due to the damage, the taper shown in FIG. 8 results. By using this tapered gate arrangement, the subsequent implants are more uniform up to the silicon gate oxide surface.

A light, carefully controlled, ion implanted p region 52, FIG. 9, is now added, which will be the channel region. After implantation, a drive-in diffusion moves this layer about one micron below the wafer surface. No oxide masking is needed because the Si/P gate serves that function as mentioned above. An n+ source region 54 is now ion implanted through the same opening in the Si/P gate grid structure. The impurity density is selected such that p+ region 48 is greater than n+ source region 54, and the depth of n+ source region 54 is typically 0.4 microns. A heavy low temperature oxide layer 56, FIG. 6, is applied, followed by a pre-ohmic and ohmic aluminum step yielding drain electrode 58 and source electrode 60.

As noted above, almost all power MOSFET design has been concentrated on vertical configurations. An example of the other general class of MOSFETs, the lateral type, is shown in FIG. 11.

Lateral MOSFET 62 has a substrate including an n− epitaxial layer 64 into which are diffused p region 66, n+ source region 68 and n+ drain region 70. Upon application of a positive voltage on gate electrode 72 relative to source electrode 74, electrons in p region 66 are attracted to the top surface of the substrate to invert the conductivity type along channel region 76 to n type, whereby electrons flow from source 68 through channel 76 through drift region 62 to drain 70, and current thus flows from drain electrode 78 through channel 76 to source electrode 74. The principal advantage of lateral device 62 is ease of implementation in integrated geometries where all leads are accessible.

As with the previously mentioned vertical MOSFETs, the lateral MOSFET 62 of FIG. 11 is unidirectional.

Device 62 is subject to the above noted tradeoff between lateral length of the drift region 80 (i.e. the distance between regions 76 and 70) versus the blocking voltage. Blocking voltage can be increased by making drift region 80 longer, but this in turn undesirably increases the ON state resistance.

It will be noted that each of the above references is to enhancement mode devices. Since the electron mobility is about 2.5 times greater than the hole mobility in silicon, the most common channel is n type. The ON state channel resistance is determined by the degree to which one can enhance the initial conductivity of the semiconductor. Thus larger gate voltages generally produce lower ON state resistances. If the devices were constructed as depletion mode units, the ON state resistance occurring at zero gate signal would be fixed by the conductivity of the starting material. Little if any reduction in ON state resistance could be effected by application of gate voltage. Since the starting resistivity must be high in order to sustain high blocking voltages in the OFF state, the ON state resistance of depletion mode devices currently being fabricated is considered too large to be a serious contender in power FET development. From this perspective, since all current JFETs are depletion mode devices, JFET configurations have not been seriously considered for power switching applications.

DETAILED DESCRIPTION OF THE INVENTION

Reviewing FIGS. 1 through 11, it is seen that in each case the transistor will not support a reverse drain to source voltage. Each device is unidirectional in that only one junction drop separates drain and source when (for the n channel devices shown) the drain is negative with respect to the source. In many applications, these devices can be effectively employed. But if AC line voltage is to be the drain-source driving function, then a bidirectional design becomes mandatory. Again, inspection of the device geometries in FIGS. 1 through 11 shows that the reason for the unidirectional design stems from the use of the device as a three terminal element, i.e. both the drain and the gate voltages are referenced to the common source point. It is necessary that the source electrode be in contact with the n+ source region and also with the p body region (to provide the gate return contact). Thus, the blocking action of the pn epijunction is negated.

Referring to FIG. 1, for example, if device 2 were supplied with a separate electrode for p region 8, and the source metalization 18 contacted only the n+ source region 10, a bidirectional FET would result. There would be considerable asymmetry due to unequal blocking capabilities of the n region 6 and p region 8. Likewise in FIG. 11, if a separate electrode is provided for p region 66 and if source metalization 74 contacted only source region 68, then a bidirectional FET would result, but there would be considerable asymmetry due to the unequal blocking capabilities of n region 64 and p region 66. Thus a new geometry and perhaps technology would be required.

Though not limited thereto, the present invention evolved from efforts to provide bidirectionality in a power FET without having to overcome these immediately above noted difficulties. The invention has broad application, however, to various lateral FETs where it is desired to increase voltage blocking capability without increasing lateral dimensions. The disclosed preferred embodiment provides in combination a simple yet effective MOSFET structure avoiding the noted difficulties while providing bidirectional current flow with high voltage blocking capability in minimum lateral dimensions.

FIGS. 12 and 13 schematically show lateral bidirectional power FET structure constructed in accordance with the invention. FET structure 102 includes a substrate 104 of one conductivity type having a top major surface 106. In preferred form, substrate 104 is an n− epitaxial layer grown on a base layer of semiconductor material such as p layer 108.

A p layer 110 is diffused into the substrate from top major surface 106 to a predetermined depth forming a first top layer. A second top layer 112 is formed in first top layer 110 by diffusion from top major surface 106 to a given depth. A plurality of laterally spaced second top layers 112, 114, 116 and so on, are provided by n+ regions.

Referring to FIG. 13, a plurality of notches 118, 120, 122 and so on, are formed in the substrate from top major surface 106 through respective n+ regions 112, 114, 116 and so on and through top layer 110 into substrate region 104. These notches may be anisotropically etched, as known in the art: C. Hu, "A Parametric Study of Power MOSFETs", IEEE Electron Device Conference, paper CH 1461-3/79, 0000-0385; IEEE Transactions Electron Devices, Volume ed-25, #10, October 1978; and Ammar and Rogers, "UMOS Transistors on Silicon", Transactions IEEE, ed-27, pages 907-914, May 1980. Alternatively, the notches may be formed by a porous silicon region in accordance with the known anodization technique of passing a fixed current through the localized region in the presence of concentrated hydrogen floride to create a structural change in the silicon which remains single crystalline with the substrate but becomes porous. After the anisotropic etch or the anodization, the substrate is subjected to an oxidizing atmosphere forming oxide layers 124, 126, 128 and so on. The remainder of the notch is preferably filled with tungsten disilicide, which is a conductor and provides the gate electrode as shown at 132, 134, 136 and so on.

Notch 118 extends from top major surface 106 downwardly through second top layer 112 and first top layer 110 into substrate region 104. Notch 118 separates the second top layer 112 into first and second source regions 140 and 142 and extends therebetween. Notch 118 separates the first top layer 110 into first and second channel regions 144 and 146 and extends therebetween. The substrate region 104 around the notch forms a drift region 148 of the substrate.

Main electrode metallization 150 is deposited on top major surface 106 to ohmically contact source region 140 and the second top layer 110 common to channel region 144. Another main electrode metallization 152 is deposited on top major surface 106 to ohmically contact source region 142 and the first top layer 110.

Upon application of a positive voltage to gate electrode 132 with respect to source region 140, electrons in p region 110 are attracted to channel region 144 to invert the conductivity type therein to n type. If main electrode 152 is positive with respect to main electrode 150, current may then flow from p layer 110 momentarily across a forward biased pn junction 154 into drift region 148, then through channel 144 to source region 140 and electrode 150. As soon as current starts to flow through the FET, the voltage across main electrodes 150 and 152 drops, which in turn reduces the potential in various regions of the FET, including portion 156 of p layer 110 adjacent the other FET channel 146. Portion 156 thus becomes negative relative to gate 132, whereby positive gate 132 attracts electrons into channel region 146 to invert the conductivity type thereof to n type, and hence render channel 146 conductive. Forward biased pn junction 154 thus conducts only momentarily until the second channel 146 turns on.

The main current path through FET 102 is from main electrode 152 through source region 142, downwardly through vertical channel region 146 along the right side of notch 118, then further downwardly into drift region 148 along the right side of the notch, then around the bottom of notch 118, then upwardly along the left side of notch 118 in drift region 148 of substrate 104, then upwardly through vertical channel region 144 along the left side of notch 118, then through source region 140 to main electrode 150.

The structure is bilateral, and thus current may also flow from main electrode 150 to main electrode 152 when gate 132 is positive with respect to source 142. Electrons in p layer 110 are attracted into channel region 146 by gate 132 to thus invert channel region 146 to n type and hence allow electron flow from n+ source region 142 through channel 146 into drift region 148 in substrate 104. If main electrode 150 is positive with respect to main electrode 152, current then flows from p layer 110 momentarily across forward biased pn junction 158 until channel 144 turns on. The main current path is from main electrode 150, through source 140, through channel 144, through drift region 148, through channel 146, through source 142 to main electrode 152. Main electrode 152 thus serves as an electron current source when a negative voltage is applied thereto relative to the voltage on main electrode 150, and serves as an anode when a positive voltage is applied thereto relative to the voltage on main electrode 150.

The application of electrical gate potential to gate electrode 132 enables the latter to produce electric fields of sufficient intensity to invert the conductivity type in the first and second channel regions 144 and 146. Upon application of voltage of either polarity to the first and second source regions 140 and 142, electric current can flow in a respective corresponding direction between them, under control of the electrical gate potential of the gate electrode means 132. The current flow between spaced apart regions 140 and 142 is controllable by controlling the electric fields in channel regions 144 and 146, which in turn are controllable by controlling the electric potential on the gate electrode means 132.

In the absence of gate potential on gate electrode 132, channel regions 144 and 146 are p type, and the device is in a blocking OFF state. Current from main electrode 150 to main electrode 152 is blocked by junction 154. Current flow in the other direction from main electrode 152 to main electrode 150 is blocked by junction 158.

Bidirectional FET 102 may be used to control AC power. FIG. 13 schematically shows a load 160 and a source of AC power 162 connected across main electrodes 150 and 152. Gate electrode 132 is connected by a gate terminal 164 to a source of gate potential 166 through switch means 168. In the ON state of FET 102, switch 168 is in an upward position such that a given polarity gate potential is applied to gate electrode 132 from source 166. When main electrode 152 is positive with respect to main electrode 150, as driven by AC source 162, gate electrode 132 is positive with respect to source region 140 and main electrode 150, connected to p layer 110. Hence, channel 144 is inverted to n type and conduction occurs, i.e., current flows from positive main electrode 152, through source region 142, through channel 146, through drift region 148 around the bottom of notch 118 in substrate 104, through channel 144, through source 140 to negative main electrode 150 and through load 160.

In the other half cycle of the AC source 162, main electrode 150 is positive with respect to main electrode 152, and gate electrode 132 is positive with respect to source region 142 and p layer 110 connected to negative main electrode 152. Conduction is thus enabled through channel 146, and current flows from positive main electrode 150 through source 140, through channel 144, through drift region 148 around the bottom of notch 118 in substrate 104, through channel 146, to source 142 and main electrode 152.

In preferred form, gate terminal 164 is referenced to the same potential level as one of the main electrodes in the OFF state of FET 102. In the leftward position of switch 168, gate terminal 164 is connected through reverse blocking diode 170 to main electrode 150.

As seen in FIG. 13, a plurality of FETs are afforded in the integrated structure. N+ regions or top layers 114 and 116, FIG. 12, are likewise split and separated into laterally spaced first and second source regions along top major surface 106 by respective notches 120 and 122. Main electrode metallizations are provided comparably to that described, and connected in series in the AC load line, or in parallel as shown in FIG. 13. Gate electrodes 134 and 136 are connected in parallel with gate electrode 132 to gate terminal 164. Main electrode 152 provides the source electrode for the FET to the left around notch 118, and also provides the source electrode for the FET to the right around notch 120. Main electrode 151 provides the drain electrode for the FET around notch 120, and also provides the drain electrode for the FET around notch 122. In the other half cycle of AC source 162, the roles of electrodes 152 and 151 are reversed, i.e. electrode 152 is the drain for its left and right FETs around respective notches 118 and 120, and electrode 151 is the source for its left and right FETs around respective notches 120 and 122. Alternate electrodes 150, 151 and so on are thus connected to one side of the AC source, and the other alternate electrodes 152, 153 and so on are connected to the other side of the AC source.

In one embodiment, the depth of the p layer 110 below top major surface 106 is about 3 microns, and the depth of the n+ layers 112, 114, and 116 is about 1 micron. The depth of notches 118, 120, 122 and so on below top major surface 106 is about 15 microns, which affords a depletion region path length of 30 microns.

There is thus shown a lateral bidirectional notched power FET, including: a first source region 140 of one conductivity type; a first channel region 144 of opposite conductivity type forming a junction 113 with first source region 112; a drift region 148 of the one conductivity type forming another junction 158 with the first channel region 144; a second channel region 146 of the opposite conductivity type forming a junction 154 with drift region 148; a second source region 142 of the one conductivity type forming a junction 143 with second channel region 146; a notch 118 extending between and separating the first and second source regions 140 and 142 and the first and second channel regions 144 and 146, and extending into drift region 148 in substrate 104; insulated gate means 132 and 124 in notch 118 proximate the first and second channels 144 and 146 and adapted for application of electrical potential for producing electric fields of sufficient intensity to invert the conductivity type in the first and second channel regions 144 and 146; whereby upon application of voltage of either polarity to the first and second source regions 140 and 142, electric current can flow in a respective corresponding direction between them, under control of the electrical potential of the gate means, the conductive current path through drift region 148 traversing along one side of notch 118 then around the end thereof and then along the other side of notch 118.

FIGS. 14 through 21 show the preferred processing and structure of the invention. Starting with a lightly doped n− substrate 202 in FIG. 14, for example having a donor density of about $6 \times 10^{14}$ donor atoms per cubic centimeter, p type epitaxial layer 204 is provided with boron at a density of about $1 \times 10^{17}$ donor atoms per cubic centimeter, and having a depth of about 3 microns. A layer of silicon dioxide $SiO_2$ is then grown on the top surface 206, followed by masking and exposing to define p areas 208 and 210, FIG. 15, followed by arsenic deposition and diffusion to provide n+ regions 212, 214, 216, and so on, to a depth of about 1 micron and having a surface concentration of $1 \times 10^{21}$. Regions 218 and 220 are the silicon dioxide areas remaining after the masking and exposure etching. During the arsenic diffusion, another silicon dioxide layer 222 forms over the top surface.

Next, a silicon nitrite $Si_4N_3$ layer 224 is deposited to a thickness of about 4 microns, to provide a high quality insulating material and a mask definition material. The silicon nitrite layer 224 is plasma etched down to top major surface 206, forming hole 226, FIG. 16, or the etch is performed down to level 230, FIG. 18.

A porous silicon region 228 is then formed by anodization in the presence of hydrogen floride as above. Contacts are placed on the top and bottom surfaces, and since silicon nitrite layer 224 is an insulator, current will only pass through the notch hole 226 to thus provide selective anodization through vertical region 228. A structural change is created in the silicon which remains single crystalline with substrate 202 but becomes porous. The depth of porous silicon region 228 below top major surface 206 is about 14 or 15 microns.

The notch is then etched down to level 230, FIG. 18, about 4 microns below top major surface 206. The silicon nitrate layer 224 and oxide layers are removed by etching and the substrate is subjected to an oxidizing atmosphere such that the oxygen enters the pores in porous region 228 and rapidly oxidizes region 228, whereby region 228 is still single crystalline with substrate 202 but substantially nonconductive. After the oxidation, a silicon dioxide layer 232, FIG. 19, also remains. The porous silicon region 228 oxidizes much faster than the growth of silicon dioxide layer 232, whereby to afford process control enabling gate oxide segments 234 and 236 along the vertical walls of the notch hole 226, FIG. 19.

Titanium disilicide $TiSi_2$ layer 238 is then deposited over the top surface by a sputtering process. Alternatives are tungsten disilicide and tantalum disilicide. Sputtering is preferred in order to prevent shadowing, i.e. gaps below corners. Layer 238 is then masked and etched, followed by low temperature silicon dioxide chemical vapor deposition, FIG. 20, providing insulating layers 240, 242, 244, and so on, and open areas 246, 248, and so on. Aluminum metallization is then sputtered or deposited in the open areas 246 and 248, resulting in main electrodes 250 and 252, FIG. 21.

Figure 21:
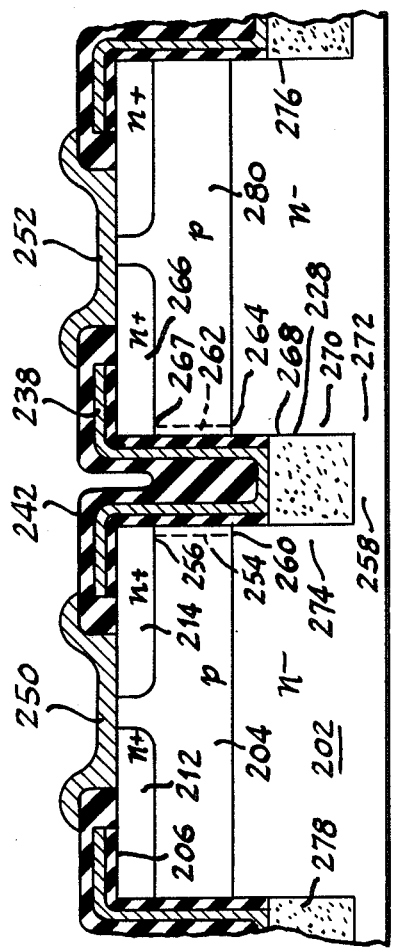

FIG. 21 shows the preferred structure of the invention. A bidirectional lateral power FET is provided by: a first source region 214 of one conductivity type; a first channel regions 254 of opposite conductivity type forming a junction 256 with first source region 214; a drift region 258 of the one conductivity type forming another junction 260 with the first channel region 254; a second channel region 262 forming a junction 264 with drift region 258; a second source region 266 of the one conductivity type forming a junction 267 with the second channel region 262; a notch 268 extending between and separating the first and second source regions 214 and 266 and the first and second channel regions 254 and 262, and extending into drift region 258; and insulated gate means 238 in notch 268 proximate the first and second channels 254 and 262 and adapted for application of electrical potential for producing electric fields of sufficient intensity to invert the conductivity type in the first and second channels 254 and 262. Upon application of voltage of either polarity to the first and second source regions 214 and 266 from respective main electrodes 250 and 252, electric current can flow in a respective corresponding direction between them, under control of the electrical potential of the gate means 238. The conductive current path through the drift region 258 traverses along one side 270 of notch 268 then around the end 272 of the notch and then along the other side 274 of the notch.

Like FIG. 13, the contact structure of FIG. 21 provides a common main electrode for adjacent FETs. If main electrode 252 is positive with respect to main electrode 250, then electrode 252 provides the source contact for the left FET around the bottom of notch 268, and also provides the source contact for the FET to the right thereof around notch 276. Likewise, electrode 250 provides the drain contact for the FET to the right thereof around notch 268, and also provides the drain contact for the FET to the left thereof around notch 278.

Unlike FIG. 13, the gate electrode 238 in FIG. 21 does not extend down too far into drift region 258 within insulator notch region 228. This prevents unwanted inducement of conduction channels in the OFF state, which in turn affords higher OFF state voltage blocking capability. In the OFF state, if the voltage on main electrode 252 is positive with respect to main electrode 250, and if gate electrode 238 is referenced to electrode 250, then as the positive voltage on main electrode 252 rises higher, the potential in substrate 202 likewise rises positively with respect to gate electrode 238 because of the single forward junction drop across pn junction 264. Gate electrode 238 thus becomes more negative relative to drift region 258 in substrate 202, and if the gate electrode extends down within insulative region 228, the gate electrode would attract holes toward the edges of insulative region 228 along the sides of notch 268. If the concentration of carrier holes along sides 270, 272 and 274 of the notch becomes great enough, then conductivity inversion to p type may occur along these sides. This inducement of conduction channels enables conduction from p region 280 through the induced p type conduction channel in drift region 258 around the notch then to p region 204.

The structure of the gate electrode means in FIG. 21 prevents unwanted inducement of conduction channels in the OFF state. The spacing of gate electrode 238 from the edges of the notch, particularly the bottom edge of the notch, substantially diminishes the attractive force on carrier holes toward the edges of notch 268, particularly around the bottom end 272. This enables higher OFF state voltage blocking capability, even in nonfloating gate implementations.

Higher OFF state voltage blocking capability is further afforded by the increased drift region current path length. The current path between the main electrodes extends from each source region downwardly through the channel regions and downwardly and around the bottom 272 of the notch. This increases the drift region current path length and affords higher OFF state voltage blocking capability without increasing the lateral dimension along the top major surface 206, whereby to afford a high density, high voltage bidirectional FET structure.

It is recognized that various modifications are possible within the scope of the appended claims.

We claim:

1. A bidirectional FET, comprising:
a first source region of one conductivity type semiconductor material;
a first channel region of opposite conductivity type semiconductor material forming a junction with said first source region;
a single drift region of one conductivity type semiconductor material forming another junction with said first channel region;
a second channel region of said opposite conductivity type semiconductor material forming a junction with said drift region;
a second source region of said one conductivity type semiconductor material forming a junction with said second channel region;
a notch extending between and separating said first and second source regions and said first and second channel regions, and extending into said drift region;
insulated gate means in said notch proximate said first and second channel regions and adapted for application of an electrical potential for producing electric fields of sufficient intensity to invert the conductivity type in said first and second channel regions;
whereby upon application of voltage of either polarity to said first and second current source regions, electric current can flow in a respective corresponding direction between them, under control of said electrical potential of said gate means, the conductive current path through said drift region traversing along one side of said notch then around the end thereof then along the other side of said notch;
said single drift region around said notch supporting OFF state blocking voltage in both directions;
wherein said channel regions are laterally sapced by said notch, and said notch extends vertically downwardly from a top major surface of said FET, said channel regions extending generally vertically along respective sides of said notch, said drift region being below said channel regions, two junctions being mesa stacked on each side of said notch, a first side of said notch having said junction between said first source region and said first channel region and said junction between said first channel region and said drift region, a second side of said notch having said junction between said second source region and said second channel region and said junction between said second channel region and said drift region;
wherein said source regions are laterally spaced along said top major surface by said notch therebetween, said source regions being above respective said channel regions;
and comprising a pair of main electrodes each connected to a respective said source region, and wherein said insulated gate means comprises insulation layer means extending along the inner surface of said notch, and gate electrode means disposed in said notch along said insulation layer means such that said gate electrode means extends in close proximity along and insulated from said vertical channel regions;

wherein said FET has an OFF state in the absence of said electric gate potential, with the junction between said drift region and one of said channel regions blocking current flow toward one of said main electrodes, and with the junction between said drift region and the other said channel regions blocking current flow toward the other of said main electrodes;

wherein the drift region current path between said main electrodes extends from said source region downwardly through said channel regions and downwardly around the bottom of said notch so as to increase the drift region current path length and afford higher OFF state blocking voltage capability, without increasing the lateral dimension along said top major surface, whereby to afford a high density, high voltage bidirectional FET structure;

wherein said notch extends downwardly into said drift region a substantial distance below said gate electrode means to substantially diminish attraction of carriers by said gate electrode means from said drift region toward the edges of said notch, to prevent unwanted inducement of conduction channels in said OFF state and afford higher OFF state voltage blocking capability.

2. The invention according to claim 1 wherein said notch extends downwardly into said drift region to a depth substantially below said channel regions, and said gate electrode means extends downwardly to about the depth of said junctions between said channel regions and said drift region.

3. Bidirectional laterally integrated power switching plural FET structure comprising:

a semiconductor body having a top major surface and including a lateral substrate layer of one conductivity type at a predetermined depth below said top major surface;

a top layer of opposite conductivity type on said substrate layer;

a plurality of top regions of said one conductivity type formed in said top layer and laterally spaced along said top major surface;

a plurality of notches, each extending downwardly from said top major surface through a respective one of said top regions and through said top layer into said substrate layer, each notch separating its respective said top region into right and left source regions laterally spaced along said top major surface by said notch therebetween, each notch also separating the portion of said top layer below its respective said top region into right and left channel regions below said right and left source regions and likewise laterally spaced by the respective said notch extending therebetween, each notch further providing a singular drift region of said one conductivity type through said substrate layer, which singular drift region extends generally vertically along the sides of said notch and around the bottom thereof to provide substantially increased singular drift region of said one conductivity type length without increased lateral dimension, said singular drift region around said notch supporting OFF state blocking voltage in both directions;

a plurality of first main electrodes connected respectively to said left source regions;

a plurality of second main electrodes connected respectively to said right source regions;

insulated gate electrode means in said notches including portions proximate said right and left channel regions for attracting given polarity carriers to invert said channel regions to said one conductivity type in response to given gate potential, such that current may flow in either direction between said first main electrodes and said second main electrodes, the conductive current path for each FET being from said left source region downwardly through a generally vertical left said channel region along the left side of said notch, then further downwardly into said drift region along said left side of said notch, then around the bottom of said notch in said drift region in said substrate layer, then upwardly along the right side of said notch and said drift region, then upwardly along a generally vertical said right channel region to said right source region, with the same path conducting current in the reverse direction from said right source region to said left source region for each said FET;

wherein said notch extends downwardly into said drift region to a depth substantially below said channel regions, and said gate electrode means extends downwardly to about the depth of the junctions between said channel regions and said drift region, the portion of said notch below said gate electrode means comprising anodized single crystalline porous silicon oxidized to a substantially insulative condition to substantially diminish attraction of carriers by said gate electrode means from said drift region toward the edges of said notch, to prevent unwanted inducement of conduction channels in an OFF state of said FET to increase OFF state voltage blocking capability.

4. The invention according to claim 2 wherein the portion of said notch below said gate electrode means comprises anodized single crystalline porous silicon oxidized to a substantially insulative condition.

5. A bidirectional lateral power FET, comprising:

a substrate of semiconductor material of one conductivity type having a top major surface;

a pair of channel regions of the other conductivity type laterally spaced in said substrate;

a pair of source regions of said one conductivity type laterally spaced along said top major surface and each forming a junction with a respective one of said channel regions;

a notch in said substrate extending downwardly from said top major surface between said source regions and said channel regions into a drift region in said substrate, such that the conductive current path is directed from one source region downwardly through a generally vertical one said channel region along one side of said notch, then further downwardly into said drift region along said one side of said notch, then around the bottom of said notch, then upwardly along the other side of said notch in said drift region, then upwardly along a generally vertical other said channel region to said other source region, with the same path conducting current in the reverse direction from said other source region to said one source region;

a pair of main electrodes connected respectively to with source regions; and insulated gate electrode means in said notch including portions proximate said generally vertical channel regions for attracting given polarity carriers to invert said channel regions to said one conductivity type in response to given gate potential, such that current may flow in either direction between said main electrodes;

wherein said notch extends downwardly into said drift region a substantial distance below said gate electrode means to substantially diminish attraction of carriers by said gate electrode means from said drift region toward the edges of said notch, to prevent unwanted inducement of conduction channels in an OFF state of said FET and afford higher OFF state voltage blocking capability.

6. The invention according to claim 5 wherein said notch extends downwardly into said drift region to a depth substantially below said channel regions, and said gate electrode means extends downwardly to about the depth of said channel regions.

7. The invention according to claim 6 wherein the portion of said notch below said gate electrode means comprises anodized single crystalline porous silicon oxidized to a substantially insulative condition.

8. A lateral power FET, comprising:
a substrate of semiconductor material including a lateral n epitaxial layer;
a p type layer on said lateral n epitaxial layer;
an n type region embedded in said p type layer;
a notch extending vertically downwardly through said n type region, through said p type layer, and into said n epitaxial layer to define a vertical plane along mesa stacked said n epitaxial layer, said p type layer and said n type region;
insulated gate means disposed in said notch including portions in close proximity to and insulated from the generally vertical regions in said p type layer on opposite sides of said notch, and adapted for application of electrical gate potential for producing controllable electric fields in said last mentioned vertical regions;
a pair of main electrodes each conductively communicating with a respective one of said embedded n type regions on opposite sides of said notch for serving as an electron current sources when a negative voltage is applied to one of said main electrodes relative to the voltage on the other of said main electrodes, and serving as an anode when a positive voltage is applied to said one main electrode relative to the voltage on said other main electrode;

whereby upon application of voltage of either polarity to said main electrodes, current flow in either direction between said embedded n type regions on opposite sides of said notch is controllable by controlling said potential on said gate means;

wherein the conductive current path through said substrate extends generally vertically along opposite sides of said notch and around the bottom thereof so as to increase the drift region path length through said n epitaxial layer of said FET without increasing the lateral dimension, whereby to afford higher voltage blocking capability in a smaller lateral area;

wherein said notch extends downwardly into said n epitaxial layer a substantial distance below said gate means to substantially diminish attraction of holes by said gate means for said n epitaxial layer toward the edges of said notch, to prevent unwanted inducement of conductive p channels between said p layers on opposite sides of said notch in an OFF state of said FET, to afford increased OFF state voltage blocking capability.

9. The invention according to claim 8 wherein said notch extends dowwardly into said n epitaxial layer to a depth substantially below said p type layers on opposite sides of said notch, and said gate means extends downwardly into said notch to about the depth of the junctions between said p layers and said epitaxial layer.

10. The invention according to claim 9 wherein the portion of said notch below said gate means comprises anodized single crystalline porous silicon oxidized to a substantially insulative condition.

* * * * *

UNITED STATES PATENT AND TRADEMARK OFFICE
CERTIFICATE OF CORRECTION

PATENT NO.   :  4,546,367

DATED        :  October 8, 1985

INVENTOR(S)  :  HERMAN P. SCHUTTEN ET AL

It is certified that error appears in the above-identified patent and that said Letters Patent is hereby corrected as shown below:

In Column 2, line 25, delete "where $R_{on}$"

In Column 7, line 18, delete "floride" and insert --fluoride--

In Column 10, line 23, delete "floride" and insert --fluoride--

In Claim 1, column 12, line 43, delete "sapced" and insert --spaced--

In Claim 5, column 14, line 66, delete "with" and insert --said--

In Claim 8, column 16, line 2, delete "sources" and insert --source--

In Claim 8, column 16, line 25, after "means" delete "for" and insert --from--

Signed and Sealed this

Seventeenth Day of December 1985

[SEAL]

Attest:

Attesting Officer

DONALD J. QUIGG

Commissioner of Patents and Trademarks